United States Patent [19]

Chin

[11] Patent Number: 4,918,449
[45] Date of Patent: Apr. 17, 1990

[54] MULTISTEP FLASH ANALOG TO DIGITAL CONVERTER WITH VOLTAGE ESTIMATOR

[75] Inventor: Sing W. Chin, Alameda, Calif.

[73] Assignee: National Semiconductor Corporation, Santa Clara, Calif.

[21] Appl. No.: 310,634

[22] Filed: Feb. 13, 1989

[51] Int. Cl.[4] .............................................. H03M 1/36
[52] U.S. Cl. ..................................... 341/156; 341/159
[58] Field of Search ......................... 341/156, 159, 155

[56] References Cited

U.S. PATENT DOCUMENTS

| | | | |
|---|---|---|---|
| 3,968,486 | 7/1976 | Gerdes | 340/347 |
| 4,143,366 | 3/1979 | Lewis, Jr. | 340/347 |
| 4,336,525 | 6/1982 | Chapple, III | 340/347 |
| 4,386,339 | 5/1983 | Henry et al. | 340/347 |
| 4,460,891 | 7/1984 | Bernstein | 341/156 |
| 4,533,903 | 8/1985 | Yamada et al. | 340/347 |
| 4,599,602 | 7/1986 | Matzuzawa et al. | 340/347 |
| 4,602,241 | 7/1986 | Dingwall | 340/347 |
| 4,608,555 | 8/1986 | Hoeft | 340/347 |
| 4,635,036 | 1/1987 | Yoshizawa | 340/347 |
| 4,639,715 | 1/1987 | Doluca | 340/347 |
| 4,691,190 | 9/1987 | Robinson | 340/347 |
| 4,712,087 | 12/1987 | Traa | 340/347 |
| 4,752,766 | 6/1988 | Shimizu et al. | 340/347 |

*Primary Examiner*—William M. Shoop, Jr.
*Assistant Examiner*—Sharon D. Logan
*Attorney, Agent, or Firm*—Steven F. Caserza; Lee Patch

[57] ABSTRACT

A novel multistep flash analog to digital converter is taught, including a voltage estimator which quickly provides a rough estimate of the analog input signal. This rough estimate is used to select appropriate reference voltage tap points for use in the first flash conversion. This first flash conversion, together with the voltage estimate, provides the most significant bits of the digital output word. A digital to analog converter is used to provide a residual voltage which is then converted by a second operation of the flash converter, thereby providing the least significant bits of the digital output word. In one embodiment, the voltage estimate is performed at the same time that the analog input signal is sampled by the flash converter in preparation for the first flash conversion. Therefore, speed of operation is not degraded by the addition of the voltage estimator.

7 Claims, 5 Drawing Sheets

MULTISTEP FLASH ANALOG TO DIGITAL CONVERTER WITH VOLTAGE ESTIMATOR

INTRODUCTION

This invention pertains to analog to digital converters, and more particularly to flash analog to digital converters wherein a plurality of comparisons between a signal related to the input signal and reference signals are made in order to provide a plurality of bits of the digital word simultaneously.

Analog to digital converters are well known in the prior art. One form of analog to digital converter utilizes successive approximation in order to use a single comparator to successively compare an input signal to one of a plurality of reference voltages. While this type of analog to digital converter is widely used, and is relatively inexpensive because it uses only a single comparator, it is inherently rather slow since a number of comparisons must be made in order to convert each analog sample into a digital output word. One example of such a successive approximation analog to digital converter is described in U.S. Pat. No. 4,691,190.

Another type of analog to digital converter is the so-called "flash" converter which includes a plurality of comparators which simultaneously compare the input signal to an associated one of a plurality of reference signals in order to simultaneously provide a plurality of output bits of the digital output word. One example of such a flash analog to digital converter is shown in U.S. Pat. No. 4,608,555. Such a flash converter requires $2^N$ comparators in order to provide an N bit output word. Thus, for an 10-bit analog to digital converter, 1024 comparators are needed.

Another type of flash analog to digital converter is the half flash analog to digital converter described in U.S. Pat. No. 4,639,715. A half flash analog to digital converter generates high and low order bits of the digital output word in sequence by two flash conversion cycles per analog input sample. The prior art half flash analog to digital converter requires only $2 \times 2^{N/2}$ comparators. Thus, for a 10-bit analog to digital converter, 64 comparators are needed. However, the speed of an analog to digital conversion performed by this type of flash analog to digital converter is approximately one half that of the prior art flash analog to digital converter which generates all bits of the digital output word simultaneously, as described in the aforementioned U.S. Pat. No. 4,608,555.

A typical N bit half flash analog to digital converter is shown in the schematic diagram of FIG. 1. This converter utilizes two N/2 bit flash converters 10 and 13 and a single N/2 bit digital to analog converter 11. The analog input signal is received on input terminal 15 and is first converted by flash converter 10 to provide N/2 bits of the digital output word. These N/2 bits are also fed to digital to analog converter 11 which provides an analog signal which is subtracted from the input signal by summing means 12. The result of this subtraction is a residual voltage which is then converted by second N/2 bit flash converter 13 in order to provide the remaining N/2 bits of the N bit output word.

SUMMARY

In accordance with teachings of this invention, a novel multistep flash analog to digital converter is taught. This multistep analog to digital converter includes a voltage estimator which quickly provides a rough estimate of the analog input signal. This rough estimate is used to select appropriate reference voltage tap points for use in the first flash conversion. This first flash conversion, together with the voltage estimate, provides the most significant bits of the digital output word. A digital to analog converter is used to provide a residual voltage which is then converted by a second operation of the flash converter, thereby providing the least significant bits of the digital output word.

In accordance with the teachings of this invention, significantly fewer components are required, thereby reducing circuit complexity, cost, and power consumption. In one embodiment of this invention, the voltage estimate is performed at the same time that the analog input signal is sampled by the flash converter in preparation for the first flash conversion. Therefore, speed of operation is not degraded by the addition of the voltage estimator.

DETAILED DESCRIPTION

Figure 1:
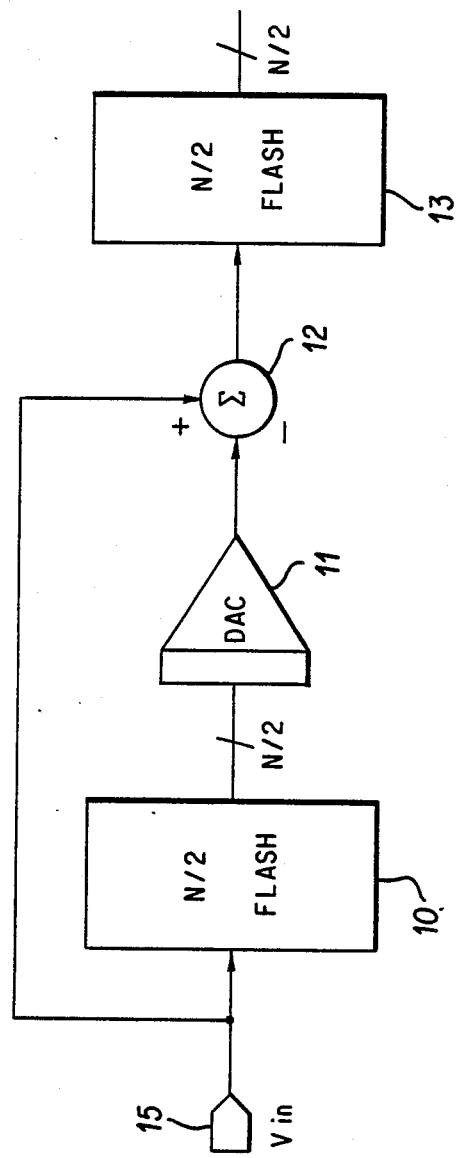
FIG. 1 is a diagram of a typical prior art half flash analog to digital converter.
Figure 2:
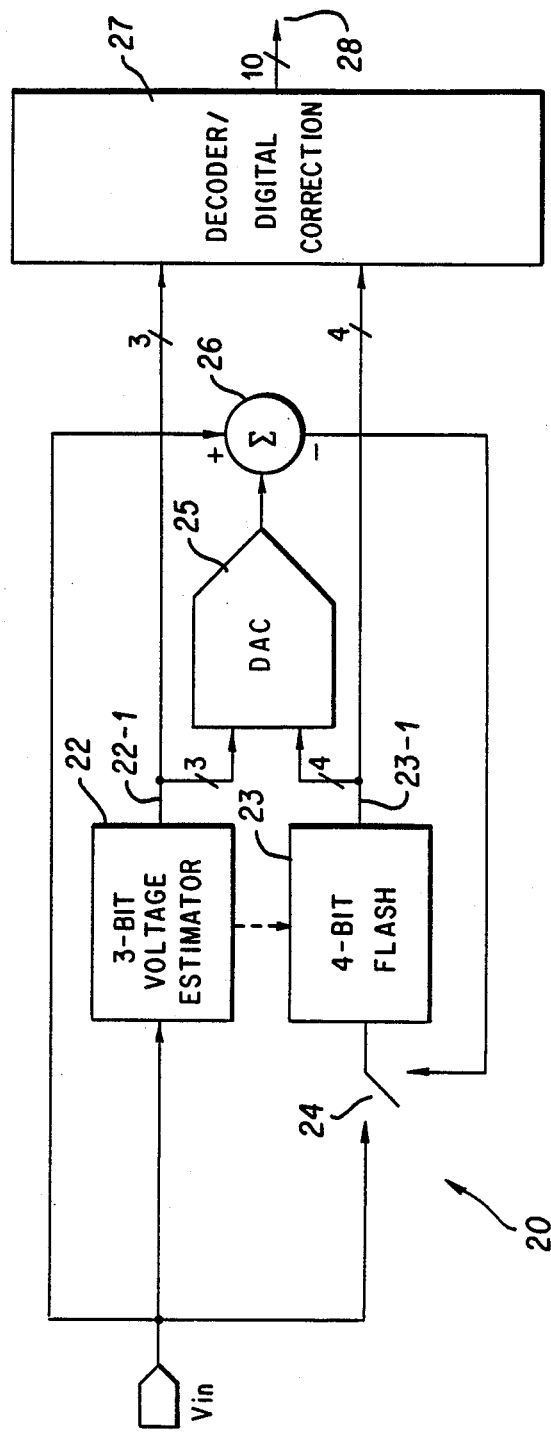
FIG. 2 is a block diagram of one embodiment of a multistep flash analog to digital converter constructed in accordance with the teachings of this invention.

FIG. 2 is a block diagram of one embodiment of a 10-bit multistep flash analog to digital converter constructed in accordance with the teachings of this invention which provides a 10-bit digital word on output bus 28 in response to a sample of an input voltage Vin which is received on input terminal 21. In accordance with the teachings of this invention, a key element is 3-bit voltage estimator 22 which provides a rough approximation of input voltage Vin. A single 4-bit flash converter 23 is used for both conversion cycles required to convert an analog input voltage Vin to a digital output word.

Referring to FIG. 2, at the beginning of an analog to digital conversion, analog input signal Vin received on input terminal 21 is evaluated by voltage estimator 22 and, at the same time, is sampled by operation of switch 24 on the input of 4-bit flash converter 23. Based upon the result of the operation of voltage estimator 22, appropriate tap points within 4-bit flash converter 23 are selected, and the first 4-bit flash conversion is performed. The three bits provided by voltage estimator 22 and the four bits provided by the first cycle of 4-bit flash converter 23 are applied to decoder/digital correction circuit 27, which in turn provides the six most significant bits of the digital output word made available on output bus 28.

After the first conversion, digital to analog converter 25 receives the three bits from voltage estimator 23 and the four bits from the first cycle of 4-bit flash converter 23 and generates an intermediate analog signal which is applied to analog summing means 26. This intermediate analog signal is subtracted by analog summing means 26 from input voltage Vin, and the resulting analog signal is applied by switch 24 to 4bit flash converter 23 for conversion during the second cycle of conversion. Appropriate reference voltages are selected by 4-bit flash converter 23 and the resulting analog signal from analog summing means 26 is converted by 4-bit flash converter 23. The 4-bit digital word provided by the second cycle of converter 23 serves as the four least significant bits of the digital output word available on output bus 28.

Since the voltage estimation is done simultaneously when analog input signal Vin is sampled by 4-bit flash converter 23, the overall conversion speed is not slowed down by the addition of voltage estimator 22. Therefore, an analog to digital converter constructed in accordance with the teachings of this invention has the same speed as a prior art half flash analog to digital converter. Due to the inclusion of 3-bit voltage estimator 22, the resolution requirement for the flash converter is reduced from N/2 bits to only (N/2)-1 bits. For a 10-bit analog to digital converter, only 16 comparators are needed in the flash converter, and only six sense amplifiers are needed in the voltage estimator. Therefore, a reduced number of components are required as compared with a prior art half flash analog to digital converter providing output words having the same number of bits, thereby reducing integrated circuit die size, which in turn decreases cost. Furthermore, with a decrease in components, power consumption is reduced compared with prior art half flash analog to digital converters.

Figure 3:
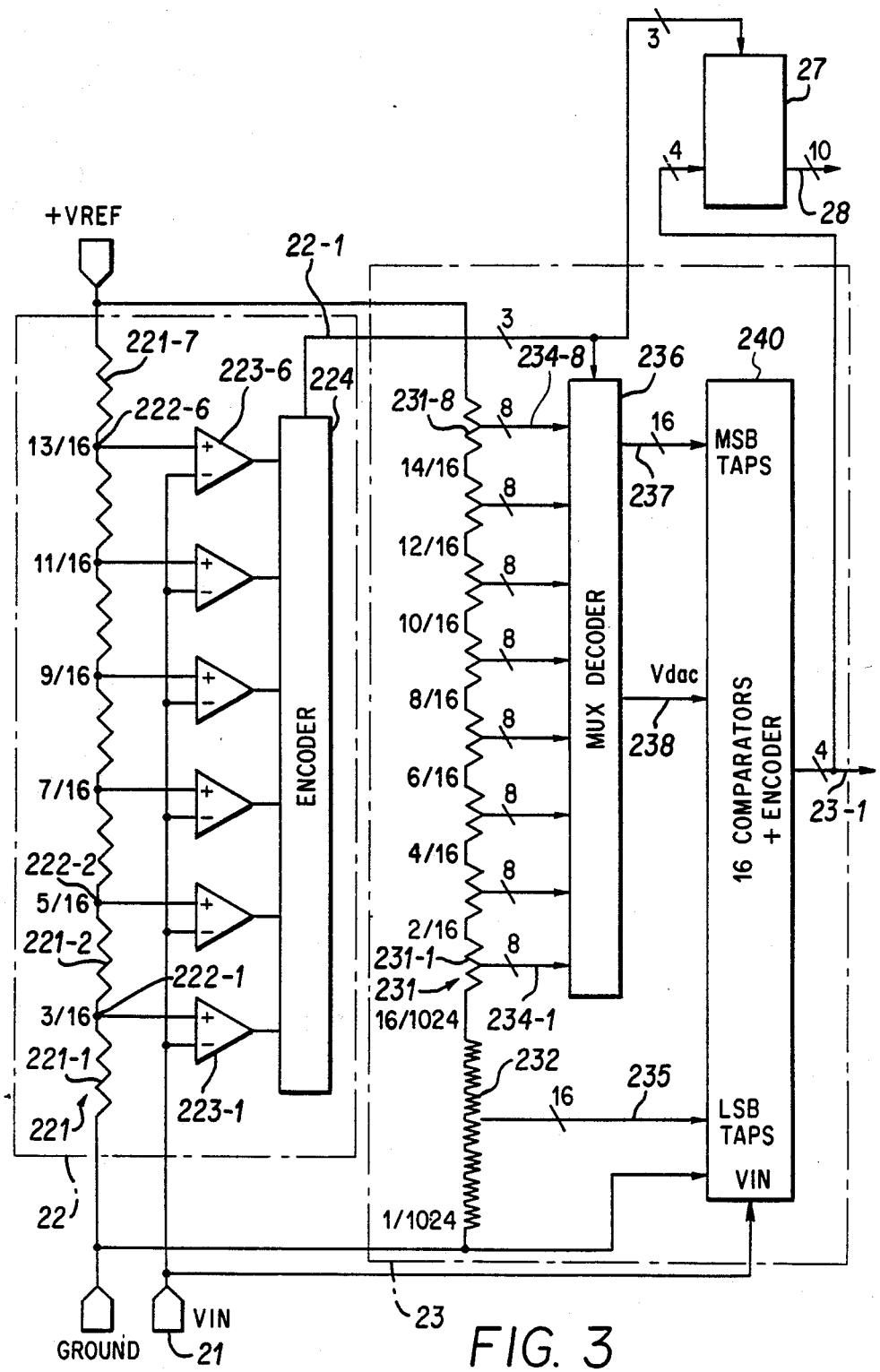
FIG. 3 is a more detailed diagram depicting the embodiment of FIG. 2.

FIG. 3 is a schematic diagram of one embodiment of 3-bit voltage estimator 22 and 4-bit flash converter 23. As shown in FIG. 3, voltage estimator 22 includes resistor ladder 221 formed of resistors 221-1 through 221-7 connected between positive and reference voltage VREF and ground, respectively. This resistor ladder has a plurality of taps 222-1 through 222-6 which are connected to one input lead of voltage sense amplifiers 223-1 through 223-6, respectively. The other input leads of voltage sense amplifiers 223-1 through 223-6 are connected in common to input voltage Vin which is applied to input terminal 21.

Figure 6:
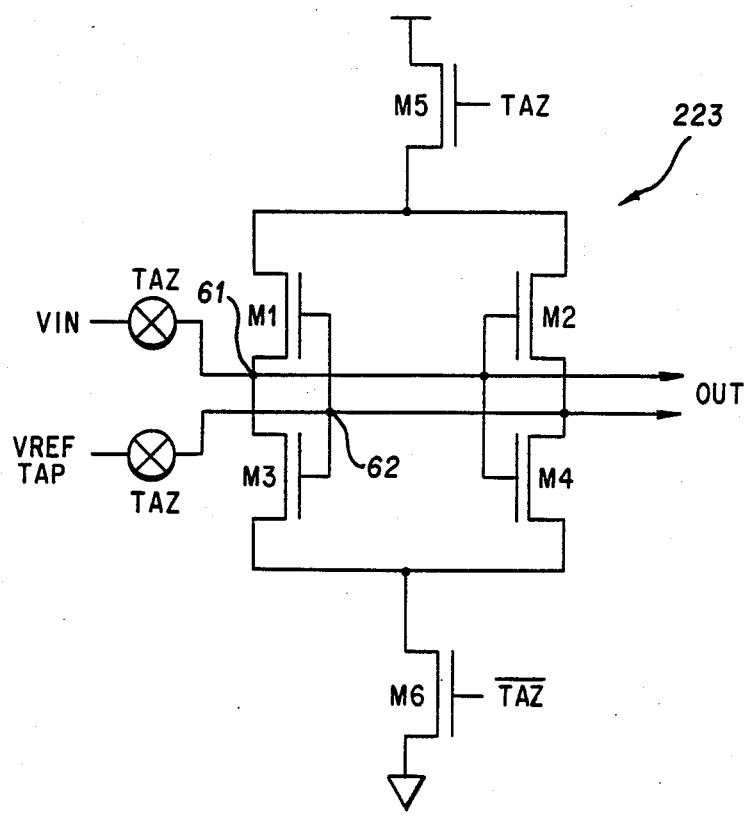
FIG. 6 is a schematic diagram of one embodiment of a sense amplifier suitable for use in accordance with the teachings of this invention.

In one embodiment of this invention, sense amplifier provides very high speed while being rather simple in design and operation. Referring to FIG. 6, sense amplifier 223 is constructed as a cross coupled latch consisting of P channel devices M1 and M2 and N channel devices M3 and M4. Sense amplifier 223 is enabled by the operation of P channel device M5 and N channel device M6 in response to clock signal Taz and its complement $\overline{Taz}$. With clock signal Taz high, input voltage Vin and reference voltage VREF(tap) (from an appropriate tap of resistor ladder 221, FIG. 3) are sampled on input/output nodes 61 and 62, respectively. Taz then goes low isolating Vin and VREF(tap) from nodes 61 and 62, respectively, and turning on devices M5 and M6, thus enabling sense amplifier 223. This causes the latch formed of devices M1 through M4 to switch to one of two states, depending on whether Vin or VREF(tap) as sampled on nodes 61 and 62, respectively, is greater. Output signals are then available on input/output nodes 61 and 62. The response time of sense amplifier 223 is, in one embodiment, less than 5 nanoseconds.

Referring again to FIG. 3, the voltages available at nodes 222-1 through 222-6 are equal to $$V(222 - N) = \frac{(2^N + 1) * VREF}{16} ; \text{ where} \quad (1)$$

$V(222 - N)$ = the voltage at a selected tap $222 - N$.

In one embodiment, voltage estimator 22 is able to provide, within approximately five nanoseconds, a 3-bit voltage estimator word on bus 22-1 for an input voltage sample Vin on input terminal 21 which is simultaneously sampled by flash converter 23. The accuracy of this 3-bit voltage estimate is not very critical since taps 222-1 through 222-6 are shifted by 1/16 VREF, in order to overlap the reference voltages on MSB resistor ladder 231, as is now described. Therefore, via digital correction logic 27 (FIG. 2) error in the voltage estimate as large as 1/16 VREF can be corrected.

4-bit flash converter 23 includes most significant bit (MSB) resistor ladder 231 including resistors 231-1 through 231-8 connected in series with least significant bit (LSB) resistor ladder 232, 16 comparators, and an encoder to provide 4-bits of resolution. Each resistor 231-1 through 231-8 within MSB resistor ladder 231 includes eight tap points which are connected via buses 234-1 through 234-8, respectively, to multiplexer 236. Thus, a plurality of eight voltage ranges are applied to multiplexer 236, and within each of the eight voltage ranges is contained eight individual voltages. At any given time, sixteen voltage references are selected by multiplexer 236 in response to the 3-bit estimator word applied to multiplexer 236 via bus 22-1. Thus, multiplexer 236 will select one of seven sets of sixteen reference voltages each, in response to the 3-bit estimator word of voltage estimator 22 on bus 22-1, i.e. those reference voltages contained on buses 234-1 and 234-2; buses 234-2 and 234-3; buses 234-3 and 234-4; buses 234-4 and 234-5; buses 234-5 and 234-6; buses 234-6 and 234-7; or buses 234-7 and 234-8. The selected sixteen taps are applied via bus 237 to comparator and encoder circuitry 240.

To allow for correction of errors in the digital output word provided by voltage estimator 22, the tap points of MSB resistor ladder 231 overlap the tap points of voltage estimator resistor ladder 221. Thus, for example, assuming that voltage estimator 22 determines the analog input signal Vin is between 5/16 VREF and 7/16 VREF, multiplexer 236 selects from MSB resistor ladder 231 the sixteen tap points between 4/16 VREF and 8/16 VREF (i.e. the sixteen tap points of resistors 231-3 and 231-4). The sixteen tap points are applied via buses 234-3 and 234-4 to decoder 236 which in turn selects and applies them via bus 237 to the 16 comparators contained within comparator and encoder circuit 240. Once these resistor taps are selected, the first 4-bit flash conversion is performed. Since the selected 16 taps of MSB resistor ladder 231 provide a voltage range which extends beyond the range provided by voltage estimator resistor ladder 221 (1/16 VREF above and 1/16 VREF below), the errors in the voltage estimate provided by voltage estimator 22 can be as large as 1/16 VREF and be corrected. The result of this first flash conversion, together with the 3-bit result from voltage estimator 22, are applied to decoder/digital correction circuitry 27 (FIG. 2) to provide the six most significant bits of the digital output word.

After the first flash conversion, the tap along MSB resistor ladder 231 nearest to but not greater than (Vin − ½ LSB) is selected as voltage Vdac on lead 238

(FIG. 3). Voltage Vdac is applied to summing means 26 (FIG. 2) and is subtracted from analog input voltage Vin. The resulting residual voltage is applied via switch 24 to 4-bit flash converter 23 which at this time selects the 16 taps of the LSB resistor ladder 23 (FIG. 3). The result of this second flash conversion provides the four least significant bits of the digital output word. These four bits of data combines with the first 6-bits of data in order to provide the final 10-bit output word on output bus 23-1.

Figure 4:
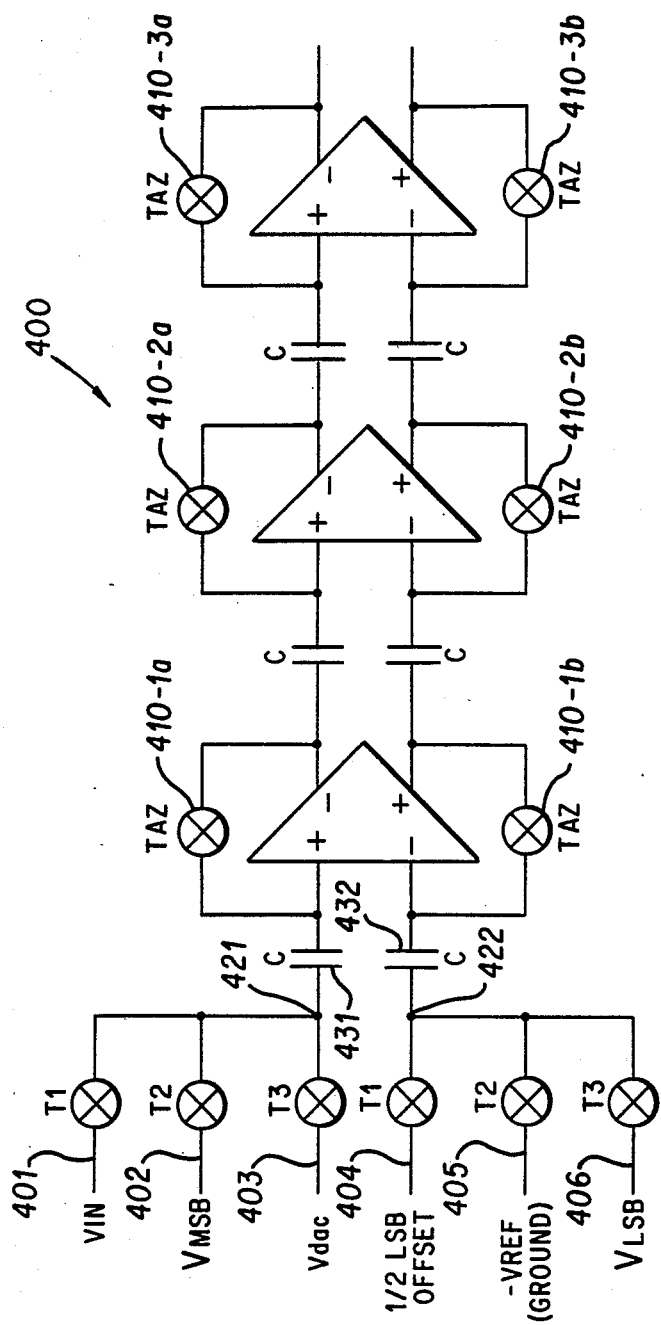
FIG. 4 is a schematic diagram depicting one embodiment of a comparator suitable for use in conjunction with the teachings of this invention.

FIG. 4 is a schematic diagram of one embodiment of one of the sixteen comparators contained within comparator and encoder circuitry 240 (FIG. 3). As shown in FIG. 4, a fully differential circuit is used, providing excellent common mode power supply rejection. A plurality of input leads are used as follows. Input lead 401 receives input voltage Vin, and input lead 402 receives a selected one of the sixteen voltages selected by multiplexer 236 from MSB resistor ladder 231 (FIG. 3). Input lead 403 receives Vdac from lead 238 (FIG. 3), and input lead 404 receives a ½ LSB voltage which is obtained, for example, by using a resistor divider (not shown) to divide in half the least significant bit voltage available on the tap closest to ground in LSB resistor ladder 232. Input lead 405 receives negative reference voltage −VREF (e.g. ground), and input lead 406 receives via bus 235 a selected one of the reference voltages from the 16 tap points of LSB resistor ladder 232 (FIG. 3).

Figure 5:
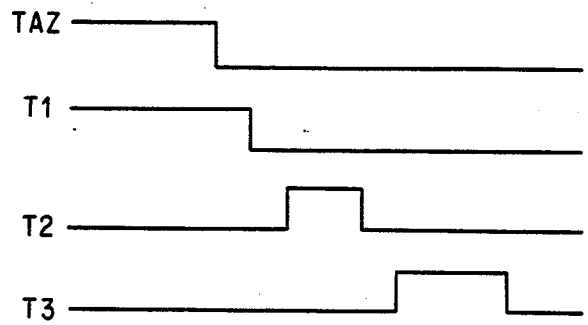
FIG. 5 depicts timing waveforms associated with the circuit of FIG. 4.

The operation of comparator 400 is now described with reference to the timing diagram of FIG. 5. When Taz is high, comparator 400 is auto zeroed by closing switches 410-1a through 410-3b. In one embodiment of this invention, this auto zero step provides an offset error voltage of less than 100 microvolts. With signal T1 high, Vin is applied to input node 421 and ½LSB offset voltage is applied to input node 422, thus causing comparator 400 to sample (Vin−½LSB). When Taz goes low (Vin−½LSB) is held across input capacitors 431 and 432.

T1 then goes low and T2 goes high, applying the MSB tap voltage $V_{MSB}$ to input node 421 and −VREF to input node 422, thus causing comparator 400 to compare (Vin−½LSB) with ($V_{MSB}$−(−VREF)), thereby completing the first flash analog to digital conversion.

T2 then goes low and T3 goes high, connecting Vdac to input node 421 and VLSB to input node 422, causing comparator 400 to compare (Vin−½LSB) with (Vdac−VLSB). This completes the second flash analog to digital conversion.

To describe the operation of the embodiment to FIG. 3, two examples are now given with reference to Table 1. Analog input signal Vin is first evaluated by voltage estimator 22 and, at the same time, sampled by comparators 223-1 through 223-6. With analog input signal Vin around 3.75 volts, voltage estimator 22 determines Vin is within the range of 11/16 VREF to 13/16 VREF. Therefore, the output of encoder 224 is 110. This output word selects via multiplexer 236 the sixteen taps on MSB resistor ladder 231 which are between 10/16 VREF and 14/16 VREF for connection to comparator array of comparator and encoder 240. A first flash conversion is now performed resulting in a 4-bit digital word. For example, when the input signal is larger than 3.75 volts (for example 3.76 volts), the 4-bit word resulting from a first flash conversion is 1000. The most significant bit of the flash conversion indicates which one of the two selected resistors of resistor ladder 231 provides a tap voltage which is closest to but not greater than (Vin−½LSB). In this case, resistor 231-7 is indicated by the logical 1 most significant bit provided by the first flash conversion. With a logical 1 most significant bit provided by the first flash conversion, the voltage estimate word need not be corrected, and correction circuit 27 selects the uncorrected estimator word (110) as the three most significant bits of output data and the three least significant bits (000) resulting from the first flash conversion as the next three bits of output data. Thus correction circuit 27 selects 110000 as the six most significant bits of output data.

On the other hand, when input signal Vin is less than 3.75 volts (e.g. 3.74 volts), the 4-bit word provided by the first flash conversion is 0111. The fact that the most significant bit resulting from the second flash conversion is a logical 0 means that the lower (231-6) of the two selected resistors of resistor ladder 231 provides the reference voltage which is nearest but not greater than (Vin−½LSB). Correction circuit 27 therefore modifies the voltage estimator data from its original value of 110 to slightly less by subtracting a logical 1 to provide a corrected estimator word of 101. Correction circuit 27 thus provides 101111 as the six most significant bits of output data.

Following the first 4-bit flash conversion, the four least significant bits are determined by comparing the sixteen taps on LSB resistor ladder 232 with the residual voltage. As previously described, the residual voltage is equal to (Vin−Vdac), where Vdac is the analog value of the four most significant bits determined by the first flash conversion operation.

TABLE 1

|  | Example 1 | Example 2 |
| --- | --- | --- |
| Vref | 5 volts | 5 volts |
| −Vref | 0 volts | 0 volts |
| Vin | 3.76 volts | 3.74 volts |
| estimator range | 11/16 Vref to 13/16 Vref | 11/16 Vref to 13/16 Vref |
| Estimator output | 110 | 110 |
| MSB taps selected | 10/16 Vref to 14/16 Vref | 10/16 Vref to 14/16 Vref |
| First Flash Conversion | 1000 | 0111 |
| Corrected Estimator Output | 110 | 101 |
| Correction Circuit Result | 110000 | 10111 |
| Vdac | 3.75 volts | 3.67185 volts |
| Residual voltage | 0.01 volts | 0.06815 volts |
| Second Flash Conversion | 0010 | 1110 |
| 10-bit output | 1100000010 | 1011111110 |

All publications and cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. An N bit multistep flash analog to digital converter comprising:
    an input terminal for receiving an analog input signal;
    an output bus for providing an N bit digital word representing the magnitude of said input signal;
    an analog signal estimator having an input lead coupled to said input terminal and an output bus for providing an M bit estimator word representing an approximate magnitude of said analog input signal;
    a P bit flash converter having an input lead for receiving an analog signal to be converted and an output bus for providing a P bit digital word representing the magnitude of said analog signal applied to said input lead of said flash converter;
    means for providing a residual analog signal equal to said input analog signal minus the analog equivalent of said M bit estimator word and a P bit digital word from a first cycle of said P bit flash converter;
    switch means for coupling said input lead of said P bit flash converter to receive said analog input signal during a first cycle of said P bit flash converter and to receive said residual analog signal during a second cycle of said P bit flash converter; and
    means for combining said M bit estimator word and said P bit digital words resulting from said first and second cycles of said P bit flash converter in order to provide said N bit digital output word.

2. An N bit multistep flash analog to digital converter as in claim 1 wherein said means for providing a residual analog signal comprises:
    a digital to analog converter having an input bus for receiving said M bit estimator word and said P bit digital word from said first cycle of said P bit flash converter, and having an output lead for providing said analog equivalent signal in response thereto; and
    summing means for receiving said analog input signal and said analog equivalent signal and providing said residual analog signal.

3. An N bit multistep flash analog to digital converter as in claim 1 wherein said analog signal estimator comprises:
    an input lead coupled to receive said analog input signal;
    an output bus for providing an M bit estimator word;
    means for providing a plurality of analog reference signals; and
    a plurality of sense amplifiers each having a first input lead coupled to said input lead of said analog signal estimator, a second input lead coupled to receive an associated one of said plurality of analog reference signals, and an output lead for providing an output signal indicating if said analog input signal is less than or greater than said associated analog reference signal.

4. An N bit multistep flash analog to digital converter as in claim 3 wherein said analog signal estimator further comprises an encoder for encoding said output signals from said plurality of sense amplifiers in order to provide said M bit estimator word.

5. An N bit multistep flash analog to digital converter as in claim 3 wherein said analog reference signals are reference voltages.

6. An N bit multistep flash analog to digital converter as in claim 5 wherein said reference voltages are provided by a resistor ladder having a plurality of tap points.

7. An N bit multistep flash analog to digital converter as in claim 1 wherein said P bit flash converter comprises:
    an input lead for receiving said analog signal to be converted;
    an output bus for providing a P bit digital word;
    means for providing a plurality of analog reference signals; and
    a plurality of sense amplifiers each having a first input lead coupled to said input lead of said P bit flash converter, a second input lead coupled to receive an associated one of said plurality of analog reference signals, and an output lead for providing an output signal indicating if said analog signal to be converted is less than or greater than said associated reference signal.

* * * * *